United States Patent
Oluwa et al.

(10) Patent No.: US 11,340,381 B2
(45) Date of Patent: May 24, 2022

(54) SYSTEMS AND METHODS TO VALIDATE PETROPHYSICAL MODELS USING RESERVOIR SIMULATIONS

(71) Applicant: Saudi Arabian Oil Company, Dhahran (SA)

(72) Inventors: Jubril Oluwa, Dhahran (SA); Dhaher Al-Elew, Dammam (SA); Charles Bradford, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 394 days.

(21) Appl. No.: 16/460,801

(22) Filed: Jul. 2, 2019

(65) Prior Publication Data

US 2021/0003741 A1 Jan. 7, 2021

(51) Int. Cl.
*G01V 99/00* (2009.01)
*G06F 30/20* (2020.01)
*G01V 1/30* (2006.01)

(52) U.S. Cl.
CPC ............ *G01V 99/005* (2013.01); *G06F 30/20* (2020.01); *G01V 1/306* (2013.01); *G01V 2210/665* (2013.01)

(58) Field of Classification Search
CPC ................ G01V 99/005; G01V 1/306; G01V 2210/665; G06F 30/20
USPC .......................................................... 703/10
See application file for complete search history.

(56) References Cited

U.S. PATENT DOCUMENTS

| | | | |
|---|---|---|---|
| 7,512,543 B2 | 3/2009 | Raghuraman et al. | |
| 8,849,623 B2 | 9/2014 | Carvallo et al. | |
| 2011/0022368 A1 | 1/2011 | Huang et al. | |
| 2011/0110192 A1* | 5/2011 | Clavaud ................. | G01V 11/00 702/14 |
| 2014/0214387 A1 | 7/2014 | Tilke | |
| 2015/0363520 A1 | 12/2015 | Bailey et al. | |
| 2016/0298426 A1* | 10/2016 | Brodie .................... | E21B 43/20 |
| 2016/0312607 A1 | 10/2016 | McNealy et al. | |
| 2016/0369590 A1 | 12/2016 | Tonkin et al. | |
| 2017/0153357 A1 | 6/2017 | Kayode | |
| 2018/0172860 A1* | 6/2018 | Wilson ..................... | G01V 1/50 |
| 2019/0213764 A1* | 7/2019 | Vennelakanti ........... | G01V 1/50 |

OTHER PUBLICATIONS

Moghaddas, Hamidreza, et al. "Lithofacies classification based on multiresolution graph-based clustering using image log in South Pars gas field." SEG Technical Program Expanded Abstracts 2017. Society of Exploration Geophysicists, 2017. pp. 3037-3041. (Year: 2017).*

(Continued)

*Primary Examiner* — Kamini S Shah
*Assistant Examiner* — John E Johansen
(74) *Attorney, Agent, or Firm* — Bracewell LLP; Constance G. Rhebergen; Christopher L. Drymalla

(57) ABSTRACT

Provided in this disclosure are systems and methods for selection of petrophysical techniques to model reservoirs. Reservoir properties were calculated using two techniques—a deterministic technique and an optimizing petrophysics technique, and simulation models were developed. The technique that yielded a simulation model that aligned more accurately and consistently with the reservoir data was selected to further develop the reservoir model.

16 Claims, 2 Drawing Sheets

(56) References Cited

OTHER PUBLICATIONS

Cavalcante, Cristina CB, et al. "History matching through dynamic decision-making." PloS one 12.6 (2017). pp. 1-32. (Year: 2017).*
Soleimani, B., S. Brumand, and F. Khoshbakht. "Petrophysical evaluation of Arab formation using multimin, petrography and petrography carbonate methods in one of Iranian oilfields, Persian gulf." The International Journal of Science and Technoledge 4.2 (2016). pp. 75-83. (Year: 2016).*
Berard, Thomas, et al. "High-resolution 3D structural geomechanics modeling for hydraulic fracturing." SPE Hydraulic Fracturing Technology Conference. OnePetro, 2015. pp. 1-23. (Year: 2015).*
Shaw, A. L., et al. "Comparison of stochastic and deterministic geologic models used in reservoir simulations for the Endicott field, Alaska." SPE Western Regional Meeting. OnePetro, 1993. pp. 1-9. (Year: 1993).*
Apostolopoulou, Maria, et al. "Estimating permeability in shales and other heterogeneous porous media: Deterministic vs. stochastic investigations." International Journal of Coal Geology 205 (2019). pp. 140-154. (Year: 2019).*
Apostolopoulou, Maria et al.; "Estimating permeability in shales and other heterogeneous porous media: Deterministic vs. stochastic investigations" International Journal of Coal Geology, 205 (2019); pp. 140-154.
International Search Report & Written Opinion for International Application No. PCT/US2020/040747, report dated Nov. 6, 2020; pp. 1-18.
Shaw, A.L. et al.; "Comparison of Stochastic and Deterministic Geologic Models Used in Reservoir Simulations for the Endicott Field, Alaska" SPE 26072, Western REgional Meeting, Anchorage, Alaska, May 26-29, 1993; pp. 1-9.
Kumar, Mithilesh et al.; "Petrophysical evaluation of well log data and rock physics modeling for characterization of Eocene reservoir in Chandmari oil field of Assam-Arakan basin, India" J Petrol Explor Prod Technol; Jul. 28, 2017; pp. 1-18.
Soleimani, B. et al.; "Petrophysical Evaluation of Arab Formation using Multimin, Petrography and Petrography Carbonate Methods in one of Iranian Oilfields, Persian Gulf" The Int'l Journal of Science & Technoledge, vol. 4 Issue 2, Feb. 2016; pp. 75-83.

* cited by examiner

SYSTEMS AND METHODS TO VALIDATE PETROPHYSICAL MODELS USING RESERVOIR SIMULATIONS

FIELD

The disclosure relates generally to the modelling of petroleum reservoirs, and more particularly, to systems and methods for evaluating computer-simulated models of reservoirs.

BACKGROUND

The behavior of hydrocarbons that are structurally or stratigraphically trapped in petroleum reservoirs is a complex process. Both static geological characteristics and dynamic flow characteristics are considered during the petrophysical reservoir modeling process. Reservoir modeling generates properties of hydrocarbon distribution and flow that facilitate understanding of the performance of the reservoirs and assists in optimization of the recovery of hydrocarbons from the reservoir. Reservoir modeling also assists in the evaluation of different operational conditions and recovery methods as applied to particular reservoirs.

SUMMARY

Provided here are systems and methods to overcome shortcomings in the art regarding validation of reservoir simulation models and selection of appropriate petrophysical technique to model reservoir performance. Embodiments include methods to select a suitable technique to construct a single well reservoir model. One such method includes processing a first plurality of data associated with a single well in a reservoir using a deterministic technique to generate a first simulation model that is representative of characteristics of the single well and processing a second plurality of data associated with the single well using an optimizing petrophysics technique to generate a second simulation model that is representative of characteristics of the single well. The method further includes comparing a first plurality of simulated characteristics from the first simulation model to measured historical data associated with the single well and comparing a second plurality of simulated characteristics from the second simulation model to the measured historical data associated with the single well. The method further includes selecting the deterministic technique to construct a single well reservoir model in response to difference between the first plurality of simulated characteristics and the measured historical data being minimal as compared to difference between the second plurality of simulated characteristics and the measured historical data, or selecting the optimizing petrophysics technique to construct a single well reservoir model in response to difference between the second plurality of simulated characteristics and the measured historical data being minimal as compared to difference between the first plurality of simulated characteristics and the measured historical data. The first plurality of data can be processed using the deterministic technique to provide simulated intrinsic permeability, effective porosity, and effective water saturation to generate the first simulation model. The first simulation model can be based upon a layered modeling of the single well with each layer having homogenous reservoir properties within it and being of 0.5 foot thickness. In some embodiments, the first simulation model is provided core analysis data over one or more cored intervals from the single well in the reservoir. The second plurality of data can be processed using the optimizing petrophysics technique to provide simulated intrinsic permeability, effective porosity, and effective water saturation to generate the second simulation model. The second simulation model can be based upon a layered modeling of the single well with each layer having homogenous reservoir properties within it and being of 0.5 foot thickness. In some embodiments, the second simulation model is provided core analysis data over one or more cored intervals from the single well in the reservoir. The measured historical data can include production data obtained from the single well in the reservoir. The production data can include information associated with oil production, gas production, water production, gas/oil ratio, pressure, temperature, and hydrocarbon composition of the single well in the reservoir.

Embodiments include systems to select a suitable technique to construct a single well reservoir model. One such system includes a processor, a reservoir database communicatively coupled to the processor, and a non-transitory computer-readable storage medium communicatively coupled to the processor and having instructions stored therein, which when executed by the processor, cause the processor to execute the methods described in this disclosure. The reservoir database is configured to store a first plurality of data associated with a single well in the reservoir. One such method includes the steps of processing a second plurality of data associated with the single well in a reservoir using a deterministic technique to generate a first simulation model that is representative of characteristics of the single well. The second plurality of data is a subset of the first plurality of data associated with a single well in a reservoir. The next step includes processing a third plurality of data associated with the single well using an optimizing petrophysics technique to generate a second simulation model that is representative of characteristics of the single well. The third plurality of data is a subset of the first plurality of data associated with a single well in a reservoir. The next step includes comparing a first plurality of simulated characteristics from the first simulation model to measured historical data associated with the single well and comparing a second plurality of simulated characteristics from the second simulation model to the measured historical data associated with the single well. As a final step, the deterministic technique is selected to construct a single well reservoir model in response to difference between the first plurality of simulated characteristics and the measured historical data being minimal as compared to difference between the second plurality of simulated characteristics and the measured historical data; or the optimizing petrophysics technique is selected to construct a single well reservoir model in response to difference between the second plurality of simulated characteristics and the measured historical data being minimal as compared to difference between the first plurality of simulated characteristics and the measured historical data.

In certain embodiments, the system further includes a data acquisition device communicatively coupled to the reservoir database. The data acquisition device can be a wireline logging tool. The second plurality of data can be processed using the deterministic technique to provide simulated intrinsic permeability, effective porosity, and effective water saturation to generate the first simulation model. In an embodiment, the first simulation model is provided core analysis data over one or more cored intervals from the single well in the reservoir. The first simulation model can be based upon a layered modeling of the single well with each layer having homogenous reservoir properties within it and being of 0.5 foot thickness. The third plurality of data can be processed using the optimizing petrophysics technique to provide simulated intrinsic permeability, effective porosity, and effective water saturation to generate the second simulation model. In an embodiment, the second simulation model is provided core analysis data over one or more cored intervals from the single well in the reservoir. The second simulation model can be based upon a layered modeling of the single well with each layer having homogenous reservoir properties within it and being of 0.5 foot thickness. The measured historical data can include production data obtained from the single well in the reservoir. The production data can include information associated with oil production, gas production, water production, gas/oil ratio, pressure, temperature, and hydrocarbon composition of the single well in the reservoir.

BRIEF DESCRIPTION OF THE DRAWINGS

The patent or application file contains at least one drawing executed in color. Copies of this patent or patent application publication with color drawing(s) will be provided by the U.S. Patent Office upon request and payment of the necessary fee. The accompanying drawings, which are incorporated in and constitute a part of this specification, illustrate embodiments of the disclosed subject matter and, together with the general description of the subject matter above and the detailed description of embodiments given below, serve to explain any number of underlying principles and provide any number of advantages.

DETAILED DESCRIPTION

Figure 1:
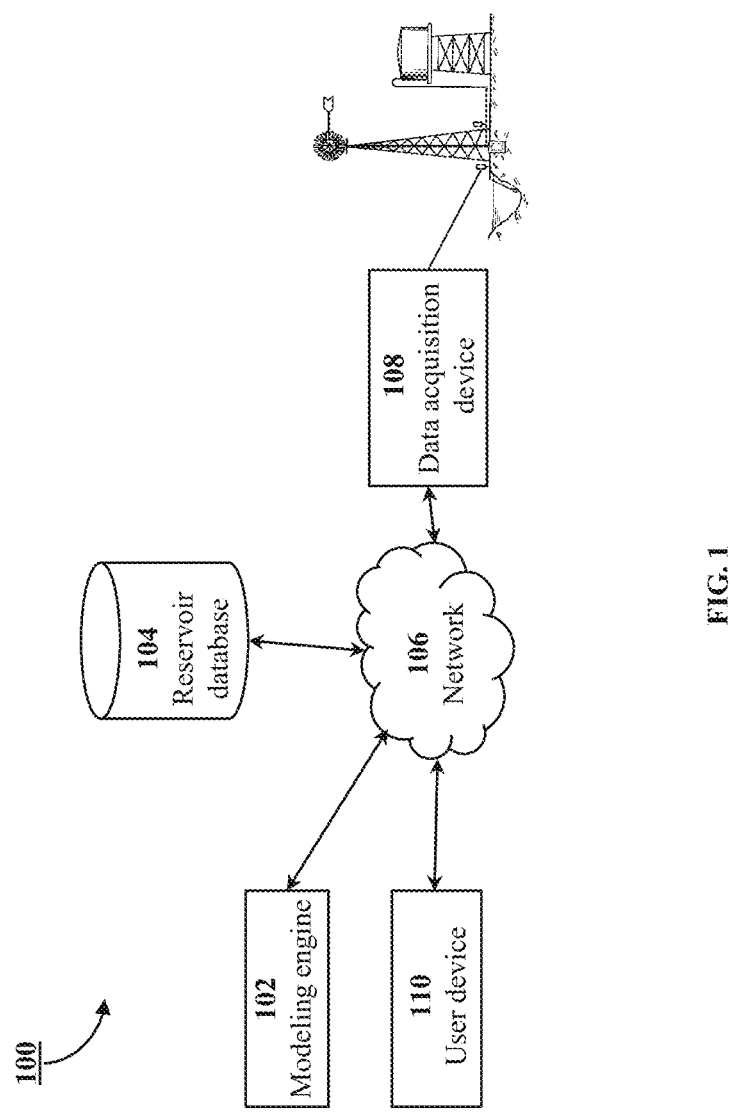
FIG. 1 is a block diagram illustrating a reservoir modelling system according to an embodiment.
Figure 2A:
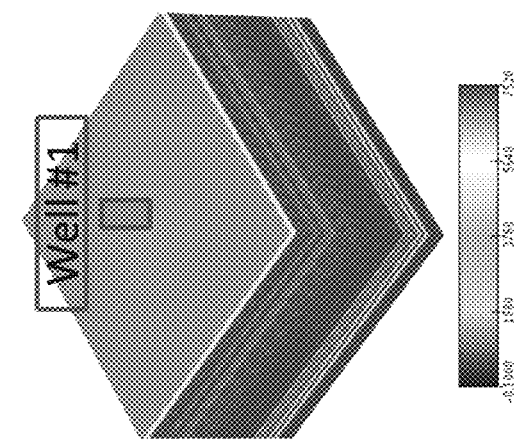
FIGS. 2A and 2B are illustrations of two simulation models developed using the deterministic method utilizing the deterministically derived inputs and an optimizing petrophysics method respectively.
Figure 2B:
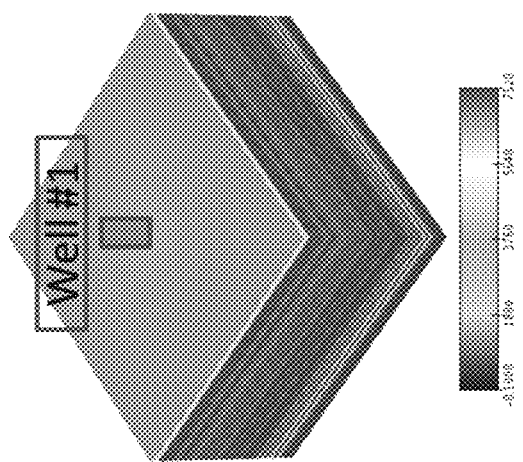

The present disclosure describes various embodiments related to computer systems and computer-implemented methods of modelling a petroleum reservoir. In various embodiments, the models are generated by using a deterministic method or an optimizing petrophysics method, and then subjected to history matching. The model that aligns more accurately and consistently with the predetermined criteria is selected to further develop the reservoir model. Further embodiments may be described and disclosed. Reference will now be made to the exemplary embodiments illustrated in the drawings, and specific language will be used here to describe the same. It will nevertheless be understood that no limitation of the scope of the disclosure is thereby intended. Alterations and further modifications of the features illustrated here, and additional applications of the underlying principles of potential embodiments, components, and operation as illustrated herein, which would occur to one skilled in the relevant art and having possession of this disclosure, are to be considered within the scope of the disclosure.

The description may use the phrases "in some embodiments," "in various embodiments," "in an embodiment," or "in embodiments," which may each refer to one or more of the same or different embodiments. Furthermore, the terms "comprising," "including," "having," and the like, as used with respect to embodiments of the present disclosure, are synonymous.

Various embodiments disclosed and described relate to computer systems and computer-implemented methods of modelling a petroleum reservoir. Reservoirs can be characterized at both the single and multiple well scales. By combining individual well performances, one can use the methods to predict the field performance. In certain embodiments, the systems and methods are directed to the simulation of a single well in the reservoir. Certain systems and methods involve the assumption of homogenous formation properties in a fine scale model. In an embodiment, a computer-implemented method compares the results of two different methods of calculating petrophysical properties—a deterministic technique and an optimizing petrophysics technique. The results from the two methods are compared to historical data, and the one with the closest match is used and optimized. The main data sets from each method are intrinsic permeability, effective porosity, and effective water saturation. If core data is available, the core data is used for generating the simulation models with greater accuracy.

Certain embodiments include systems and methods to validate simulation models generated by different techniques and select a suitable technique to construct a single well reservoir model. Developing a robust reservoir model is key to obtaining reliable forecasts of reservoir performance under different production conditions, and thus optimizing the output from the hydrocarbon reservoirs. The reservoir is divided into a series of interconnected zones and models are developed to understand and predict the flow of hydrocarbons. Layering methods within the individual zones in the reservoir model were adopted. In certain embodiments, layers of variable thickness were considered. In certain embodiments, layers of constant thickness were considered. Certain embodiments of the method include adopting layers of constant thickness and variable thickness depending on the properties of the reservoir. The method can accommodate layers of varying thickness depending on the data resolution quality, or the nature of the reservoir, or both. In certain embodiments, homogenous reservoir properties for each of a plurality of vertical layers of a single well are assumed. In an embodiment, the layering methods assume vertical layers ranging in thickness from 0.1 foot to 1 foot. In an embodiment, data from the log sample was obtained at 0.5 ft layers and was accommodated in the model. This was done in order to match the log data depth resolution. Data associated with each of the reservoir properties is acquired from a variety of sources—seismic data, borehole data, wireline log data, radiometric data, well history, or core analysis data. In certain embodiments, data provided to the deterministic technique or the optimizing petrophysics technique can include structural data such as geological faults and fault properties. While the data sets provided to the two models are the same, the optimizing petrophysics technique enables the direct inclusion of petrographic data, X-ray powder diffraction, and core data. In certain embodiments, the reservoir properties include one or more of lithology, porosity, clay volume, grain size, water saturation, and permeability. In certain embodiments, the reservoir properties include one or more of intrinsic permeability, effective porosity, and effective water saturation. Other reservoir properties can be used such as mineral properties like shale content and lithology, movable hydrocarbons, relative permeability, productivity, fracture intensity and direction, pore volume, or hydrocarbon pore volume. Mineralogy and fluid properties and behavior can be accounted in each approach; however, the optimizing petrophysics model consumes this data more effectively. A first reservoir model generates a first set of simulated properties of the single well. This first reservoir model is generated using a deterministic technique in response to the data acquired from one of more of reservoir data sources, such as borehole data, wireline log data, radiometric data, and well performance data. In certain embodiments, the effective porosity, effective water saturation and intrinsic permeability are provided as the deterministic data set. In an embodiment, the data is calibrated with the core analysis data over one or more cored intervals to determine effective porosity and is evaluated over the entire zone that will be simulated. In an embodiment, the Archie water saturation electrical parameters and formation water resistivity are determined from core and fluid samples and used to generate a simulated model. A porosity permeability relationship is also developed and calibrated to the core data.

A second reservoir model generates a second set of simulated properties of the single well. This second reservoir model is generated using an optimizing petrophysics technique in response to the data acquired from one of more of reservoir data sources, such as borehole data, wireline log data, radiometric data, and well performance data, and optionally any available core data corresponding to any of the vertical layers. In certain embodiment, the optimizing petrophysics technique utilizes data solely from log analysis. In certain embodiments, the optimizing petrophysics model is based using the minerals data from core description, reservoir fluid properties, and the Archie water saturation electrical parameters. The model is calibrated to match the core data available and provides effective porosity and water saturation as the outputs. A porosity permeability relationship is also developed and calibrated to the core data. The outputs—effective porosity, effective water saturation and intrinsic permeability—are provided as the optimizing petrophysics data set.

The simulated characteristics of the single well from the first reservoir model and the second reservoir model of the single well are compared to the historical data about the single well. Depending on which technique has generated a reservoir model that aligns best with the historical data about the single well and captures the level of details necessary for forecasting reservoir behavior with high confidence, the deterministic technique or the optimizing petrophysics technique is chosen for further development of the reservoir model. History matching assists with validation of the simulated reservoir models when the simulated model aligns with the historical field and well behavior. In an embodiment, each of the sets of simulated properties is used to create a synthetic history of reservoir performance and this synthetic history is used in the history matching process. In an embodiment, a mismatch function can be developed that quantifies the mismatch between the set of simulated properties and the historical data. The deterministic technique or the optimizing petrophysics technique is chosen for further development of the reservoir model depending on which approach yields the lower mismatch function. In certain embodiments, first set of simulated properties and the second set of simulated properties are evaluated using other criteria, such as accuracy of the reservoir model based on the simulated properties with respect to production history, production rates, or pressure characteristics at the well.

A deterministic technique is a modelling method which contains no random components, where each component or input is exactly specified by the analyst. For example, the total porosity is calculated from a cross plot of density and neutron cross-plot. This value is then fed into an equation for effective porosity to account for presence of shale. And, this output is used in Archie's water saturation equation (or another suitable equation) in conjunction with a deep reading resistivity measurement and accompanying assumptions about the formation water resistivity, cementation & saturation exponents and the tortuosity factor. An error in any of the assumptions or measurements is carried on through the deterministic method and remains in the end solution. As this method is data-driven, the quality of data inputs determines the resulting model from the deterministic analysis. An example of a software application for the deterministic technique include Determin® (part of Paradigm® Geolog® Formation Evaluation software from Emerson Paradigm Holding LLC, located at 820 Gessner Rd, Houston, Tex. 77024, USA). An optimizing petrophysics method is a modeling approach that optimizes the volumes of fluids and minerals present in the measured formation in order to minimize the error in difference between predicted logging tool outputs and the actual measurements. Utilizing foreknowledge of the mineral constituents of the formation either through examination of drill cuttings or from previous knowledge, the optimizing petrophysics method generally converges to an answer that is more representative of the actual porosity, fluid and mineral volumes when compared to core measurements. Additionally this method is allows the integration of all petrophysical data, such as wireline logs, core analysis, x-ray diffraction data, and petrographic data. Such data may reside in a reservoir database that contains information for the various petrophysical properties and fluid behavior in the reservoir. Examples of software applications for the optimizing petrophysics technique include Multimin (part of Paradigm® Geolog® Formation Evaluation software from Emerson Paradigm Holding LLC, located at 820 Gessner Rd, Houston, Tex. 77024, USA), MineralSolver™ (part of Interactive Petrophysics (IP™) product from Lloyd's Register, located at 71 Fenchurch Street, London, United Kingdom), and Quanti.ELAN™ (Schlumberger TechLog™ software).

In certain embodiments, a single well reservoir simulation model is presented that assumes homogenous formation properties in a fine scale model along the drainage area in vertical gas wells. This model is used to compare history matching using the reservoir petrophysical properties calculated using two methods, the deterministic technique (Determin®) and the optimizing petrophysics technique (Multimin®). The petrophysical parameters of porosity, permeability, and water saturation are determined using the two methods to select the best method to use before committing to a method to build an entire geologic model. Certain embodiments involve the assumption of accurate fluid composition data. In certain embodiments, a deterministic petrophysical technique is executed using a standard set of well log data and provides outputs of porosity, water saturation and permeability to the simulation engineer for wells used to test methodology. In certain embodiments, an optimizing petrophysics technique is executed using a standard set of well log data and provides outputs for porosity, water saturation and permeability to the simulation engineer for wells used to test methodology.

Also provided here are computer-based systems to select a suitable technique to construct a single well reservoir model. One such system includes a processor and a reservoir database communicatively coupled to the processor. The reservoir database is configured to store data associated with a single well in the reservoir. This database may also store data associated with other wells in the reservoir and about the reservoir as a whole. This database may also store data associated with other comparable reservoirs in the region and other parts of the world. The system also includes a non-transitory computer-readable storage medium communicatively coupled to the processor and having instructions stored therein, which when executed by the processor, cause the processor to execute a series of steps. The steps include processing a subset of data associated with the single well in a reservoir using a deterministic technique to generate a first simulation model that is representative of characteristics of the single well. In certain embodiments, this subset of data is processed using the deterministic technique to provide simulated intrinsic permeability, effective porosity, and effective water saturation to the first simulation model. This first simulation model may be provided with core analysis data over one or more cored intervals from the single well in the reservoir. This first simulation model may be based upon a layered modeling of the single well with each layer having homogenous reservoir properties within it and being of 0.5 foot thickness. The steps executed by the processor include processing a subset of data associated with the single well using an optimizing petrophysics technique to generate a second simulation model that is representative of characteristics of the single well. In certain embodiments, this subset of data is processed using the optimizing petrophysics technique to provide simulated intrinsic permeability, effective porosity, and effective water saturation to the second simulation model. This second simulation model may be provided with core analysis data over one or more cored intervals from the single well in the reservoir. This second simulation model may be based upon a layered modeling of the single well with each layer having homogenous reservoir properties within it and being of 0.5 foot thickness. The steps executed by the processor further include comparing a set of simulated characteristics from the first simulation model and a set of simulated characteristics from the second simulation model to measured historical data associated with the single well. If the difference between the set of simulated characteristics from the first simulation model and the measured historical data is minimal as compared to difference between the set of simulated characteristics from the second simulation model and the measured historical data, then the deterministic technique is selected to construct a single well reservoir model. If the difference between the set of simulated characteristics from the first simulation model and the measured historical data is minimal as compared to difference between the set of simulated characteristics from the second simulation model and the measured historical data, then the optimizing petrophysics technique is selected to construct a single well reservoir model. In certain embodiments, a data acquisition device, such as a wireline logging tool, is communicatively coupled to the reservoir database. The measured historical data includes production data obtained from the single well in the reservoir. The production data can include one or more information associated with oil production, gas production, water production, gas/oil ratio, pressure, temperature, and hydrocarbon composition of the single well in the reservoir.

FIG. 1 is a block diagram illustrating an exemplary reservoir modelling system 100 including a modelling engine 102. One or more of the methods disclosed herein may be performed by one or more computing devices in the system described in 100. Each of the different components of the reservoir modelling system 100 may be implemented in any type of computer-based architecture including suitable processor-controlled devices that receive, process, and/or transmit electronic data, configured as further described below and in FIG. 1. In certain embodiments, modelling engine 102 can be implemented as software that executes program instructions to perform the arithmetical, logical, and input/output operations described here. The modelling engine 102 can be implemented using a single-processor system including one processor, or a multi-processor system including any number of suitable processors that may be employed to provide for parallel and/or sequential execution of one or more portions of the methods described herein. In some embodiments, modelling engine 102 can be executed by a server, one or more server computers, a client computing device and the like. Examples of suitable implementations of the modelling engine 102 include servers, authorized client computing devices, smartphones, desktop computers, laptop computers, tablet computers, and other types of processor-controlled devices that receive, process, and/or transmit digital data. In an example, modelling engine 102 performs certain operations that are required for the proper operation of system architecture 100. The modelling engine 102 performs these operations as a result of central processing unit executing software instructions contained within a computer-readable medium, such as within memory. In one embodiment, the software instructions of the system are read into memory associated with the modelling engine 102 from another memory location, such as from a storage device, or from another computing device via a communication interface. In this embodiment, the software instructions contained within memory instruct the modelling engine 102 to perform processes that are described herein. Alternatively, hardwired circuitry may be used in place of or in combination with software instructions to implement the processes described herein. Thus, implementations described herein are not limited to any specific combinations of hardware circuitry and software.

In FIG. 1, the modelling engine 102 receives data from several databases, including but not limited to a reservoir database 104. Other databases can include publicly available databases (for example, Gulf Cost Log Library and Geological Data Library), commercial databases (for example, TGS's Interactive digital library, HIS Markit®, and Divestco's EnerGISite®), and company-specific proprietary databases. In certain aspects, the reservoir database 104 and a combination of one or more of the other databases can be a single entity, a set of nested databases, or may be a group of interconnected databases. Data described herein as being stored in the reservoir database 104 can also be stored or maintained in non-transitory memory and accessed among subroutines, functions, modules, objects, program products, or processes, for example, according to objects and/or variables of such subroutines, functions, modules, objects, program products or processes. Non-transitory computer-readable media include all computer-readable media, with the sole exception being a transitory, propagating signal. Databases can be, for example, a single database, multiple databases, or a cloud-based database, including data from multiple sources, for example, servers on the World Wide Web.

Each of these databases is communicatively coupled to the modelling engine 102 via a network 106. The network 106 may include any communication architecture, inclusive of devices and software, which facilitates communication between transmitter and receiver residing in one or more computing devices that form the system 100. The network components may be implemented in dedicated processing equipment, or alternatively in a cloud processing network. The network 106 may be the intranets, local area networks (LAN), cloud networks, virtual private networks (VPN), wireless area networks (WAN), and the internet, or any other network that enables servers and user devices to interact with one another. Non-limiting examples of devices comprising the network 106 may include routers, switches, hubs, firewalls, proxy servers, telecommunications trunks, and the like. Accordingly, the network 106 can be implemented, in whole or in part, over wireless communications network. In addition, according to various exemplary embodiments, the wireless communications network can be implemented over any of various wireless communication technologies, for example: code division multiplexed access, global system for mobile communications, and wireless local area network such as WiFi, World Interoperability for Microwave Access, or Bluetooth®.

In certain embodiments, the modelling engine 102 processes the request for data and analysis, and any query parameters from the user device 110 and stores the processed data at the reservoir database 104. For example, a user can provide specific parameters to be used as part of the simulation models or the history matching process. The processed data can include data used to generate the simulation models and the data generated by the simulation models. The modelling engine 102 can generate a graphical user interface at the user device 110 to facilitate interaction with system 100 via one or more computing-networks 106. Graphical user interfaces include one or more displays presented on a user device 110 that enable a user interaction with the modelling engine 102 or other devices in the system 100, associated data acquisition devices 108, and processing functionalities.

Data acquisition devices 108 are one or more tools that provide data about the qualitative and quantitative characteristics of the reservoir and hydrocarbons. Examples of data acquisition devices 108 include logging tools, induction or resistivity devices, litho-density devices, neutron porosity devices, acoustic devices, caliper devices, gamma-ray devices, electromagnetic imaging devices, fluid capacitance logging devices, multifrequency measurement devices, pressure testing devices, temperature measurement devices, rock and fluid sampling devices

EXAMPLES

Various examples are described to illustrate selected aspects of the various embodiments of systems and methods to validate petrophysical models using reservoir simulations.

Example 1

In this example, well information, such as gas rates and data from pressure transient analysis and production logging tools, were acquired. Log ASCII Standard (LAS) files from Resilient Distributed Datasets (RDDs) for geophysical wire line well logs were also obtained. Excel sheets were generated to have static properties that served as input into GigaPOWERS™, a proprietary reservoir simulator software available from Saudi Aramco. This methodology assumed homogenous reservoir properties for each layer. The vertical layers had a thickness of 0.5 ft per layer, which made this a very fine resolution model. The main inputs to the simulation models are intrinsic permeability, effective porosity, and effective water saturation as determined by the two petrophysical approaches. Additionally, if core readings are present, they were used in place of both approaches in the cored interval for more accuracy. Two simulated models were generated using the deterministic technique and the optimizing petrophysics technique. These models were then subject to history matching that compares the model to the historical data of the reservoir. Historical data includes information associated with field and well characteristics and hydrocarbon behavior, such as the quality and quantity of pressure and production data. Production data are selected from information associated with oil production, gas production, water production, gas/oil ratio, pressure, temperature, and hydrocarbon composition in the reservoir. Other information can include historical data of the reservoir as prescribed by current best practices. The simulated model that closely reproduced the historical behavior of the reservoir is used to forecast future reservoir performance.

This approach was used to model nine vertical wells in carbonate reservoirs. For the nine wells, the reservoir properties that were derived from the optimizing petrophysics model closely matched the historical data of the wells. For example, the pressure points modeled were within 50 pounds per square inch (psi) of the static bottom hole pressures. The gas in place estimate was within 10% of the gas in place obtained using material balance. On the other hand, the reservoir properties that were derived from the deterministic petrophysical model closely matched the historical data of only four of the nine wells. The models derived from the deterministic method and the optimizing petrophysics method yielded similar results in the newly drilled wells. However, the results diverged for older wells. These models diverge as each model includes different levels of uncertainty in the input datasets, which can only be determined after dynamic data validation (using this single well approach). The single well model approach proved to be valuable tool for evaluating the log analysis being used in a larger integrated reservoir study. This approach provides fast and reliable single well models. Surprisingly, the optimizing petrophysics approach yielded more consistent and accurate models as compared to the models derived from the deterministic petrophysical approach.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described here are to be taken as examples of embodiments. Elements and materials may be substituted for those illustrated and described here, parts and processes may be reversed or omitted, and certain features of the embodiments may be utilized independently, all as would be apparent to one skilled in the art after having the benefit of this description of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described. The processes and methods may be modified to facilitate variations of their implementation and use. The order of the processes and methods and the operations provided may be changed, and various elements may be added, reordered, combined, omitted, modified, etc. Portions of the processes and methods may be implemented in software, hardware, or a combination thereof. Some or all of the portions of the processes and methods may be implemented by one or more of the processors, modules, or applications described here.

As used throughout this application, the word "may" is used in a permissive sense (such as, meaning having the potential to), rather than the mandatory sense (such as, meaning must). The words "include," "including," and "includes" mean including, but not limited to. As used throughout this application, the singular forms "a", "an," and "the" include plural referents unless the content clearly indicates otherwise. As used throughout this application, the term "from" does not limit the associated operation to being directly from. Thus, for example, receiving an item "from" an entity may include receiving an item directly from the entity or indirectly from the entity (e.g., by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A method for selecting a suitable technique to construct a single well reservoir model, the method including the steps of:
processing a first plurality of data associated with a single well in a reservoir using a deterministic technique to generate a first simulation model that is representative of characteristics of the single well;
processing a second plurality of data associated with the single well using an optimizing petrophysics technique to generate a second simulation model that is representative of characteristics of the single well,
wherein the first simulation model and the second simulation model are generated using log data of a given depth resolution and are each generated using a layered modeling of the single well with each vertical layer of the layered modeling having homogenous reservoir properties and a constant thickness that matches the given log data depth resolution;
comparing a first plurality of simulated characteristics from the first simulation model to measured historical data associated with the single well;
comparing a second plurality of simulated characteristics from the second simulation model to the measured historical data associated with the single well; and
selecting the deterministic technique to construct a single well reservoir model in response to difference between the first plurality of simulated characteristics and the measured historical data being minimal as compared to difference between the second plurality of simulated characteristics and the measured historical data; or
selecting the optimizing petrophysics technique to construct a single well reservoir model in response to difference between the second plurality of simulated characteristics and the measured historical data being minimal as compared to difference between the first plurality of simulated characteristics and the measured historical data.

2. The method of claim 1, wherein the first plurality of data is processed using the deterministic technique to provide simulated intrinsic permeability, effective porosity, and effective water saturation to generate the first simulation model.

3. The method of claim 1, wherein the given log data depth resolution and the constant thickness are 0.5 foot.

4. The method of claim 1, wherein the first simulation model is provided core analysis data over one or more cored intervals from the single well in the reservoir.

5. The method of claim 1, wherein the second plurality of data is processed using the optimizing petrophysics technique to provide simulated intrinsic permeability, effective porosity, and effective water saturation to generate the second simulation model.

6. The method of claim 1, wherein the second simulation model is provided core analysis data over one or more cored intervals from the single well in the reservoir.

7. The method of claim 1, wherein the measured historical data includes production data obtained from the single well in the reservoir.

8. A system for selecting a suitable technique to construct a single well reservoir model, the system comprising:
a processor;
a reservoir database communicatively coupled to the processor, the reservoir database configured to store a first plurality of data associated with a single well in a reservoir;
a non-transitory computer-readable storage medium communicatively coupled to the processor and having instructions stored therein, which when executed by the processor, cause the processor to:
process a second plurality of data associated with the single well in a reservoir using a deterministic technique to generate a first simulation model that is representative of characteristics of the single well, wherein the second plurality of data is a subset of the first plurality of data associated with a single well in a reservoir;
process a third plurality of data associated with the single well using an optimizing petrophysics technique to generate a second simulation model that is representative of characteristics of the single well, wherein the third plurality of data is a subset of the first plurality of data associated with a single well in a reservoir,
wherein the first simulation model and the second simulation model are generated using log data of a given depth resolution and are each generated using a layered modeling of the single well with each vertical layer of the layered modeling having homogenous reservoir properties and a constant thickness that matches the given log data depth resolution;
compare a first plurality of simulated characteristics from the first simulation model to measured historical data associated with the single well;
compare a second plurality of simulated characteristics from the second simulation model to the measured historical data associated with the single well; and
select the deterministic technique to construct a single well reservoir model in response to difference between the first plurality of simulated characteristics and the measured historical data being minimal as compared to difference between the second plurality of simulated characteristics and the measured historical data; or
select the optimizing petrophysics technique to construct a single well reservoir model in response to difference between the second plurality of simulated characteristics and the measured historical data being minimal as compared to difference between the first plurality of simulated characteristics and the measured historical data.

9. The system of claim 8, further comprising a data acquisition device communicatively coupled to the reservoir database.

10. The system of claim 9, wherein the data acquisition device is a wireline logging tool.

11. The system of claim 8, wherein the second plurality of data is processed using the deterministic technique to provide simulated intrinsic permeability, effective porosity, and effective water saturation to generate the first simulation model.

12. The system of claim 8, wherein the first simulation model is provided core analysis data over one or more cored intervals from the single well in the reservoir.

13. The system of claim 8, wherein the given log data depth resolution and the constant thickness are 0.5 foot.

14. The system of claim 8, wherein the third plurality of data is processed using the optimizing petrophysics technique to provide simulated intrinsic permeability, effective porosity, and effective water saturation to generate the second simulation model.

15. The system of claim 8, wherein the second simulation model is provided core analysis data over one or more cored intervals from the single well in the reservoir.

16. The system of claim 8, wherein the measured historical data includes production data obtained from the single well in the reservoir.

* * * * *